US012677483B2

(12) United States Patent
Gleeson et al.

(10) Patent No.: US 12,677,483 B2
(45) Date of Patent: Jul. 7, 2026

(54) METHOD OF MANUFACTURING A SENSOR DEVICE

(71) Applicant: Melexis Technologies NV, Tessenderlo (BE)

(72) Inventors: Rachel Gleeson, Tessenderlo (BE); Luc Buydens, Tessenderlo (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 395 days.

(21) Appl. No.: 18/534,074

(22) Filed: Dec. 8, 2023

(65) Prior Publication Data

US 2024/0297260 A1 Sep. 5, 2024

(30) Foreign Application Priority Data

Mar. 3, 2023 (EP) ..................................... 23159944

(51) Int. Cl.
| | |
|---|---|
| *H10F 19/80* | (2025.01) |
| *G01J 5/04* | (2006.01) |
| *H10F 71/00* | (2025.01) |
| *H10W 76/48* | (2026.01) |
| *H10W 76/60* | (2026.01) |

(52) U.S. Cl.
CPC .............. *H10F 19/80* (2025.01); *G01J 5/045* (2013.01); *H10F 71/00* (2025.01); *H10W 76/48* (2026.01); *H10W 76/60* (2026.01)

(58) Field of Classification Search
CPC ...... H10F 19/80; H10F 19/804; H10F 19/807; H10F 19/85; H10K 30/88; H10W 76/60; H10W 20/213; H10W 20/021–0265; H10W 20/031–068
See application file for complete search history.

(56) References Cited

U.S. PATENT DOCUMENTS

| | | | |
|---|---|---|---|
| 2014/0254979 | A1 | 9/2014 | Zhang et al. |
| 2020/0309603 | A1 | 10/2020 | Varpula et al. |

FOREIGN PATENT DOCUMENTS

| | | |
|---|---|---|
| CN | 107224274 A | 10/2017 |
| CN | 109256340 A | 1/2019 |
| WO | WO-2005/083374 A1 | 9/2005 |
| WO | WO-2018/166095 A1 | 9/2018 |

OTHER PUBLICATIONS

European Search Report for European Application No. 23159944 dated Aug. 22, 2023.

*Primary Examiner* — Amar Movva
(74) *Attorney, Agent, or Firm* — Harness, Dickey & Pierce, P.L.C.

(57) ABSTRACT

A method of manufacturing a sensor device (100) comprises forming (200) a substrate (102) comprising a sensor element followed by forming (202) a cap layer (104). The cap layer (104) is then bonded (204) to the substrate (102) before the substrate (102) is thinned (206). A via is formed (210) between the sensor element and a back side of the thinned substrate (102). An electrical connection is provided between the sensor element and the back side of the thinned substrate (102). A mask is formed (208) on the cap layer (104) to define an area about a predetermined window region (108) before forming (210) of the via. A portion of the cap layer (104) about the predetermined window region (108) of the cap layer (104) is removed (212) after formation (210) of the via.

18 Claims, 7 Drawing Sheets

START

Process CMOS substrate wafer ~200

Process cap wafer ~202

Bond cap wafer to CMOS substrate wafer ~204

Thin CMOS substrate wafer ~206

Form oxide hard mask ~208

Form TSVs ~210

DRIE etch T-shaped profile into cap wafer ~212

Dice combined wafers into sensor dies ~214

STOP

METHOD OF MANUFACTURING A SENSOR DEVICE

CROSS-REFERENCE TO RELATED APPLICATION(S)

This application claims priority under 35 U.S.C. § 119 to European Patent Application No. 23159944.0, filed on Mar. 3, 2023, the entire contents of which are incorporated herein by reference.

FIELD

The present invention also relates to a method of manufacturing a sensor device, the method being of the type that comprises bonding a substrate comprising a sensor element to a cap layer.

BACKGROUND

Wearable electronic devices, so-called "wearables", are commonplace in modern society. These devices are capable of a great many functions, including communications with other devices, provision of information, and monitoring of certain metrics relating to performance of the human body, for example heart rate, heart rhythm, and body temperature.

To measure body temperature, it is known to employ a so-called "Far InfraRed" (FIR) sensor. Although relatively small, the space constraint for incorporation of such sensors into wearable devices, particularly but not exclusively earbuds, is particularly challenging given the overall form factor of the wearable device.

In order to reduce the overall dimensions of the FIR sensor, and thereby facilitate incorporation into a wearable device in a space-efficient manner, it is known to provide electrical contacts on a backside of a substrate that forms part of the FIR sensor. Following assembly of the FIR sensor by bonding a cap layer to a front side of the substrate, these contacts are provided by forming vias in the substrate from a backside of the substrate (the exposed side following assembly) to provide conduits between predetermined connection points within or on the opposite (front) side of the FIR sensor and external connection points on the backside of the substrate, respectively. Contact pads are then formed at the respective external connection points. For some FIR sensor structures, it is desirable to thin the substrate prior to formation of the vias in order to facilitate faster etching of the vias and improve reliability of etching of the vias. However, such thinning results in a structural weakening of the substrate that can lead to damage to the FIR sensor devices during manufacture.

Furthermore, for some applications, it is desirable for the FIR sensor device to possess an inverted T-shape to facilitate sealing of the FIR sensor device with a housing of a wearable device, for example an audio earbud, thereby preventing the ingress of moisture and dirt into the housing of the wearable device. Where the FIR sensor comprises a two-part form of the substrate mentioned above and a cap layer, the cap layer can be selectively thinned, for example in a peripheral region about a predetermined central window region in order to form the inverted T-shape.

WO 2018/166095 describes an alternative structure for providing a thermal sensor having a generally T-shape (inverted). This structure is monolithic, an infrared sensing element being integrally formed with a package that is subsequently intended to be provided in a "terminal housing". Electrical contacts are not provided on the backside of the package body using vias.

SUMMARY

According to a first aspect of the present invention, there is provided a method of manufacturing a sensor device, the method comprising: forming a substrate comprising a sensor element; forming a cap layer; bonding the cap layer to the substrate; thinning the substrate; forming a via between the sensor element and a back side of the thinned substrate; providing an electrical connection between the sensor element and the back side of the thinned substrate; wherein the method further comprises: forming a mask on the cap layer to define an area about a predetermined window region before forming of the via; and removing a portion of the cap layer about the predetermined window region of the cap layer after formation of the via.

Forming the cap layer may further comprise: disposing a getter material on at least part of an inner surface of the cap layer.

Bonding the cap layer to the substrate layer may comprise: glass frit bonding the cap layer to the substrate layer.

Bonding the cap layer to the substrate layer may further comprise: bonding the cap layer to the substrate layer in a pressurized atmosphere comprising a predetermined gas at a predetermined pressure.

Thinning the substrate may comprise: thinning a backside of the substrate using a DRIE technique.

The method may further comprise: etching the via using a DRIE technique.

Removing the portion of the cap layer about the predetermined window region of the cap layer may comprise: etching the portion of the cap layer using a DRIE technique.

According to a second aspect of the present invention, there is provided a method of manufacturing a sensor device, the method comprising: forming a substrate comprising a sensor element; forming a cap layer; bonding the cap layer to the substrate; thinning the substrate; forming a via between the sensor element and a back side of the thinned substrate; providing an electrical connection between the sensor element and the back side of the thinned substrate; wherein the method further comprises: forming a mask on the cap layer to define an area about a predetermined window region before formation of the via; and removing a portion of the cap layer about the predetermined window region of the cap layer before formation of the via; and replacing the removed portion of the cap layer with another material to restore the cap layer to having a planar structure.

The another material may be a thermally resistant polymer.

The replacement material may be removed after formation of the via.

The cap layer may be bonded to the substrate at a predetermined temperature, and the replacement material may have a higher melting point than the predetermined temperature.

According to a third aspect of the present invention, there is provided a method of manufacturing a sensor device, the method comprising: forming a substrate comprising a sensor element; forming a cap layer; bonding the cap layer to the substrate; thinning the substrate; forming a via between the sensor element and a back side of the thinned substrate; providing an electrical connection between the sensor element and the back side of the thinned substrate; wherein formation of the cap layer comprises: providing a first layer of silicon separated from a second layer of silicon by an oxide layer; profiling the first layer of silicon in order provide a predetermined window region; and removing a portion of the second layer of silicon of the cap layer about the predetermined window region to expose a portion of the oxide layer, the portion of the second layer being removed after forming the via.

Bonding the cap layer to the substrate may comprise: bonding the first layer of silicon to the substrate.

The method may further comprise: depositing a mask on the second layer of silicon to define the portion of the second layer of silicon to be removed.

The method may further comprise: etching the masked second layer of silicon until the oxide layer is reached.

The mask may be deposited on the second layer of silicon prior to formation of the via.

The method may further comprise: etching a first channel about the predetermined window region to expose a portion of the oxide layer; and etching a second channel in the first layer of silicon; the second channel may be further from a central axis of the cap layer than the first channel.

The method may further comprise: etching the exposed portion of the oxide layer to release a part of the second layer of silicon that is not forming the window region.

It is thus possible to provide a method of manufacturing a sensor device where the T-shaped sensor is less prone to breakage during the manufacturing process and thus has a consequential rise in device yield. The method also facilitates the formation of an inverted T-shaped sensor that comprises electrical contacts on a back side thereof for integration is a space-efficient manner in a housing. Where a silicon-on-insulator (Sol) structure is employed as the cap layer, when forming a raised window region of an outer surface of the cap layer, it is possible to control the depth of etching of the cap layer more accurately and uniformly than by timed etching of the cap layer. Additionally, the placement of the vias is not dependent upon size and shape of the window of the sensor device and vice versa, i.e. the placement and size of the vias does not dictate the shape and size of the window and so sensor devices comprising windows of reduced size can be produced.

BRIEF DESCRIPTION OF THE DRAWINGS

At least one embodiment of the invention will now be described, by way of example only, with reference to the accompanying drawings, in which.

DETAILED DESCRIPTION OF THE EXAMPLE EMBODIMENTS

Figure 1:
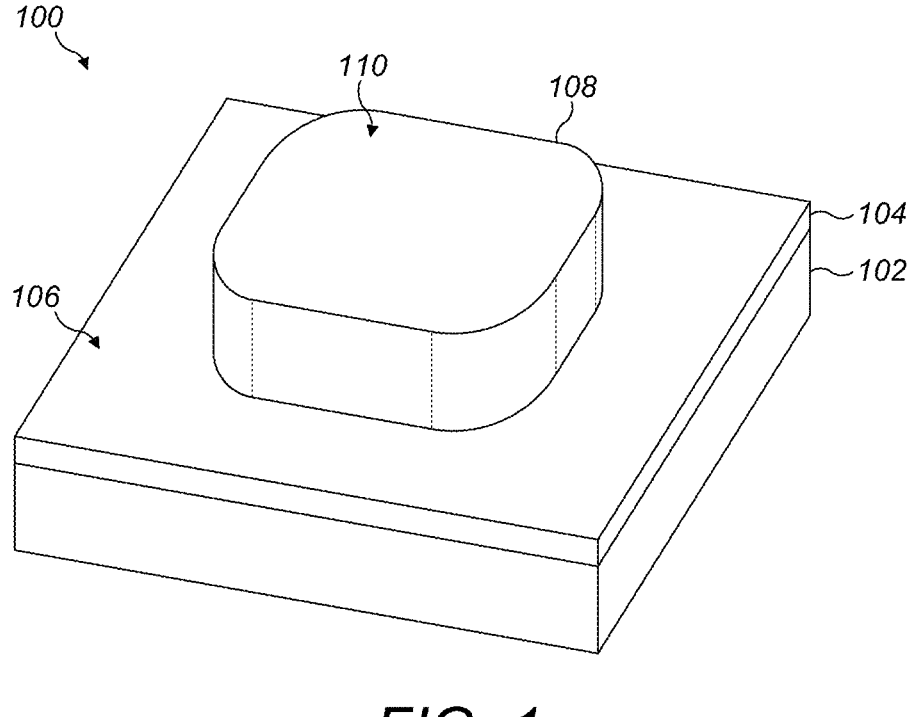
FIG. 1 is a perspective view of a sensor device.

Throughout the following description, identical reference numerals will be used to identify like parts.

Referring to FIG. 1, a sensor device 100, for example an infrared sensor device for measuring temperature, comprises a substrate portion 102 and a cap portion 104. The cap portion 104 is bonded to the substrate portion 102. The cap portion 104 is profiled so as to provide a sealing surface 106 surrounding a window portion 108 that is raised above the sealing surface 106. The window portion 108 is, in this example, generally cuboid with curved corners and a generally rectangular flat surface 110 substantially parallel with the sealing surface 106. However, the window portion 108 can be shaped differently, for example the window portion 108 can be generally cylindrical in shape.

Figure 2:
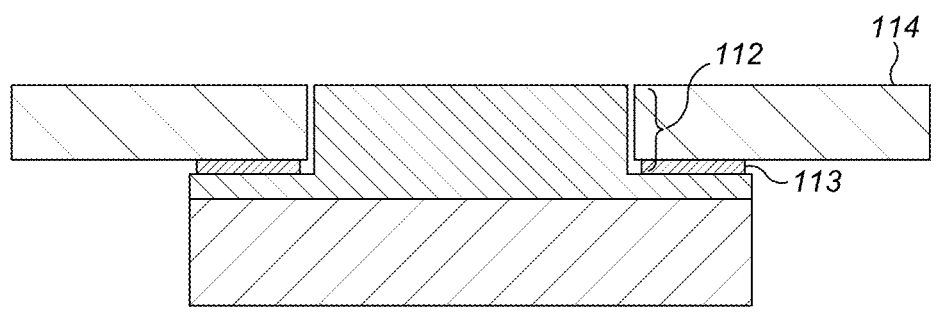
FIG. 2 is a schematic diagram of the sensor device of FIG. 1 in cross-section and disposed in an apparatus for use.

Referring to FIG. 2, in this example, the height of the window portion 108 corresponds a thickness 112 of a housing 114 of an apparatus and a layer of adhesive 113 used to bond the sealing surface 106 of the sensor device 100 to the housing 114 in which the sensor device 100 is to be sealingly installed, for example a wearable electronic device (not shown). The skilled person will appreciate that the sensor device 100 also comprises internal structural features specific to the kind of sensor being formed. In this example, the sensor device 100 is a thermal sensor and so is configured to detect infrared electromagnetic radiation. The sensor device 100 therefore comprises, for example, a membrane suspended by beams within a cavity formed by internal profiling of the substrate portion 102 and the cap portion 104. The membrane typically carries a thermopile thereon, hot ends of the thermopile being located on the membrane and cold ends of the thermopile being coupled to bulk material of the substrate portion 102 via the beams. In some examples, the cavity can comprise a layer of a getter material and the cavity can be backfilled with a gas to provide an internal pressure to the cavity. Of course, this is just one kind of thermal sensor and the sensor device 100 can be formed so as to employ different sensing techniques to measure temperature, for example the sensor device 100 can be of a bolometer type. The exact nature of the sensor device 100 and thus the property being sensed is not central to the embodiments set forth herein, but rather the embodiments relate to the attainment of a specific form-factor, which is a generally T-shaped form factor to enable a window portion of the sensor device to fit into a complementarily shaped aperture configured to receive the protruding window portion therein in a sealing manner. Additionally, the sensor device 100 has contacts formed on the backside thereof coupled to electrical contact points within the sensor device 100 by way of vias formed through the substrate portion 102. As such, the skilled person should appreciate that the sensor device 100 can be any suitable sensor device, for example a pressure sensor device, where it is desirable for the sensor device to have a window portion that fits into an aperture of a housing and lies substantially flush with an outer surface of the housing. For this reason, the detail of the functional aspects of the sensor device, specifically the aspects that provide the sensing capability of the sensor device, will not be described in further detail herein for the sake of clarity and conciseness of description.

Figure 3:
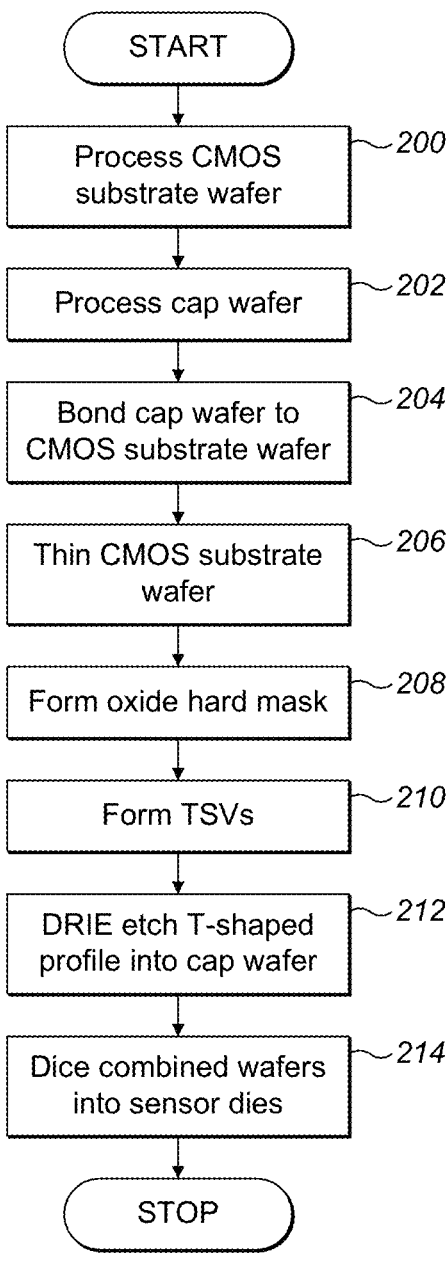
FIG. 3 is a flow diagram of a first method of manufacturing the sensor device of FIG. 1 constituting an embodiment of the invention.
Figure 4:
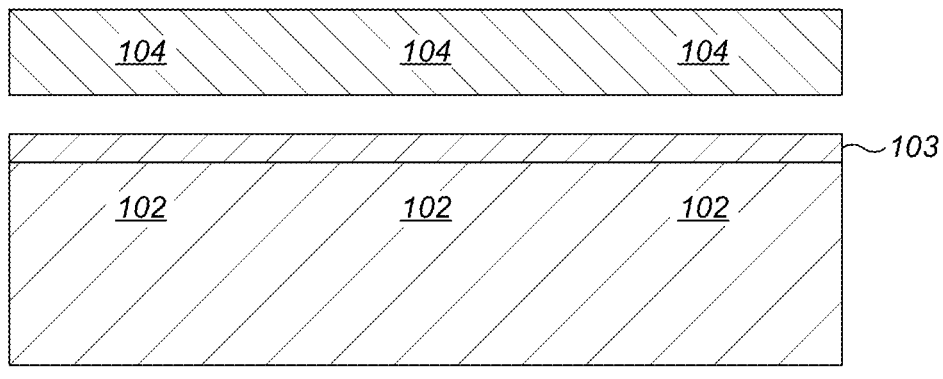
FIG. 4 is a schematic diagram of a CMOS substrate wafer and a cap wafer employed in the method of FIG. 3.

Turning to FIG. 3, a substrate wafer, for example a Complementary Metal Oxide Semiconductor (CMOS) wafer (FIG. 4), comprising multiple substrate portions 102 and CMOS processed portions 103 is formed (Step 200) using any suitable semiconductor processing technique required to form the sensor device 100. Similarly, a cap wafer (FIG. 4) comprising multiple wafer portions 104 is formed (Step 202) using any suitable semiconductor processing technique required to form the sensor device 100. The cap wafer and the substrate wafer are formed so that when brought together in an aligned manner, the individual substrate portions 102 and cap portions 104 are in registry and align to form respective sensor devices 100.

Figure 5:
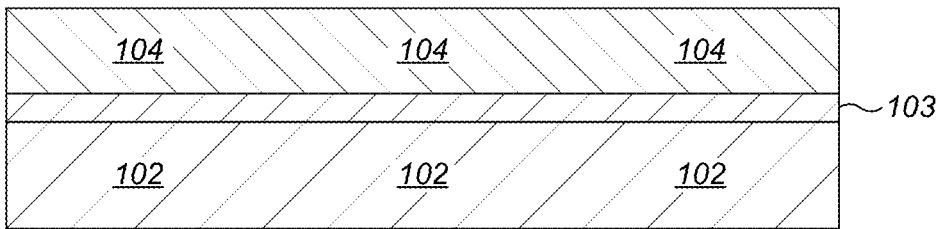
FIG. 5 is a schematic diagram of the CMOS substrate wafer of FIG. 4 bonded to the cap wafer, the CMOS wafer also having been thinned.

In this example (FIG. 5), the CMOS substrate wafer is bonded (Step 204) to the cap wafer in the aligned manner described above. Any suitable bonding technique can be employed, for example glass-frit bonding or Aluminum Germanium eutectic bonding or oxide fusion bonding techniques.

Thereafter, the CMOS substrate wafer is prepared for the formation of Through-Silicon Vias (TSVs) therethrough by thinning (Step 206) the CMOS substrate and thus all the respective substrate portions 102. In this regard, the CMOS substrate can be thinned to any suitable thickness for example between about 200 and about 500 microns. In this example, a mechanical grinding technique is employed, but any other suitable technique can be used.

Figure 6:
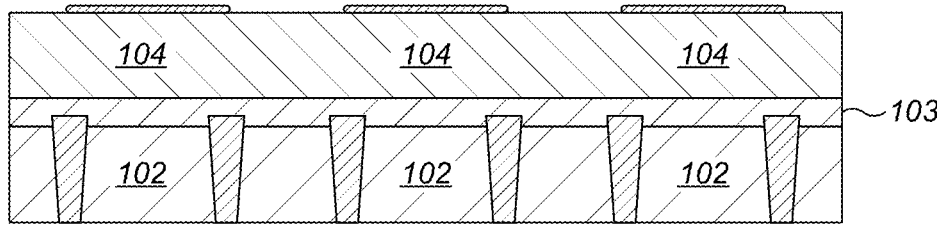
FIG. 6 is a schematic diagram of the CMOS substrate and cap wafers of FIG. 5 following patterning and formation of vias.

In this example, photoresist is then spun coated onto the cap wafer and patterned using any suitable lithographic processing technique in order to form (Step 208) an oxide hard mask 116 (FIG. 6) on the cap wafer and thus define the window portions 108. However, in other examples, the definition of the window portions 108 can take place prior to thinning the CMOS substrate. The TSVs 118 are then formed (Step 210) in the CMOS substrate wafer using the DRIE technique mentioned above or a metal assisted chemical etching technique. In this example, electrical contacts are formed on a backside (not shown) of each substrate portion 102 of the CMOS substrate wafer and are electrically connected to the TSVs, respectively.

Figure 7:
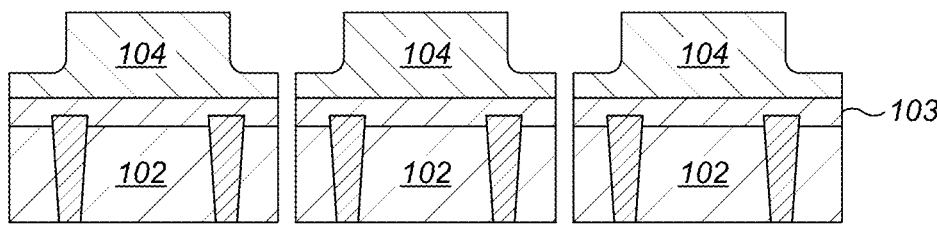
FIG. 7 is a schematic diagram of etched and diced devices formed according to the method of FIG. 3.

Once the TSVs have been formed, the cap wafer is DRIE etched (Step 212) to a desired depth in order to create the T-shaped profiles of the sensor devices 100 (FIG. 7). DRIE is employed in order to achieve substantially vertical side walls. However, where slanted sidewalls are acceptable, a so-called wet etching technique can be employed. Thereafter, the oxide hard mask is removed using any suitable oxide removal technique, and then the combined cap and CMOS substrate wafers bonded together are diced (Step 214) to form individual sensor dies constituting the sensor devices 100, the dicing being a separate process to the DRIE etching.

Figure 8:
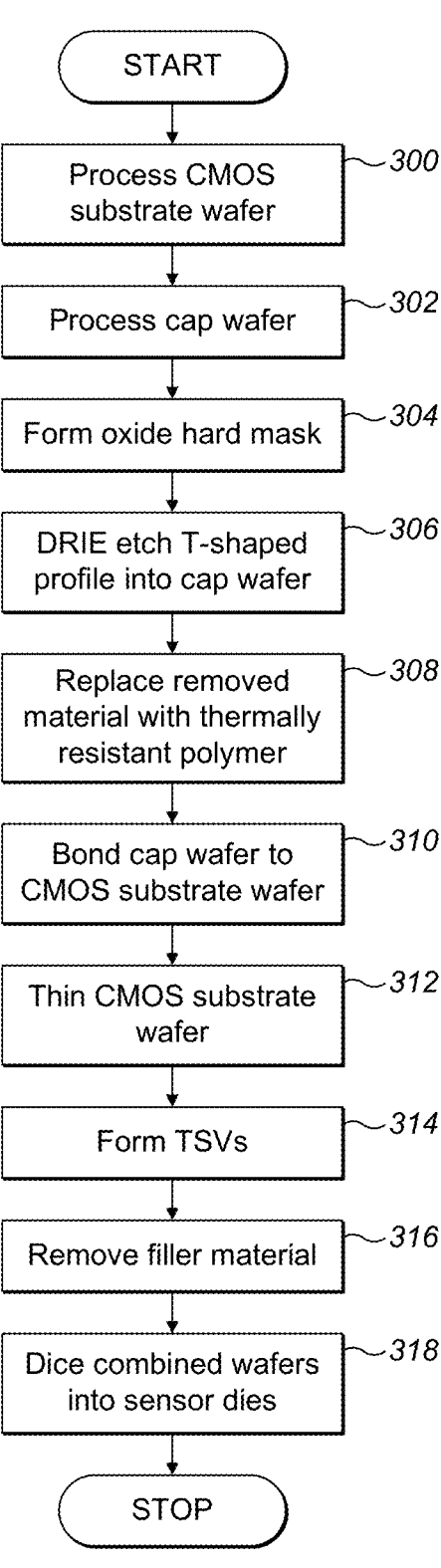
FIG. 8 is a flow diagram of a second method of manufacturing the sensor device of FIG. 1 constituting second embodiment of the invention.
Figure 9:
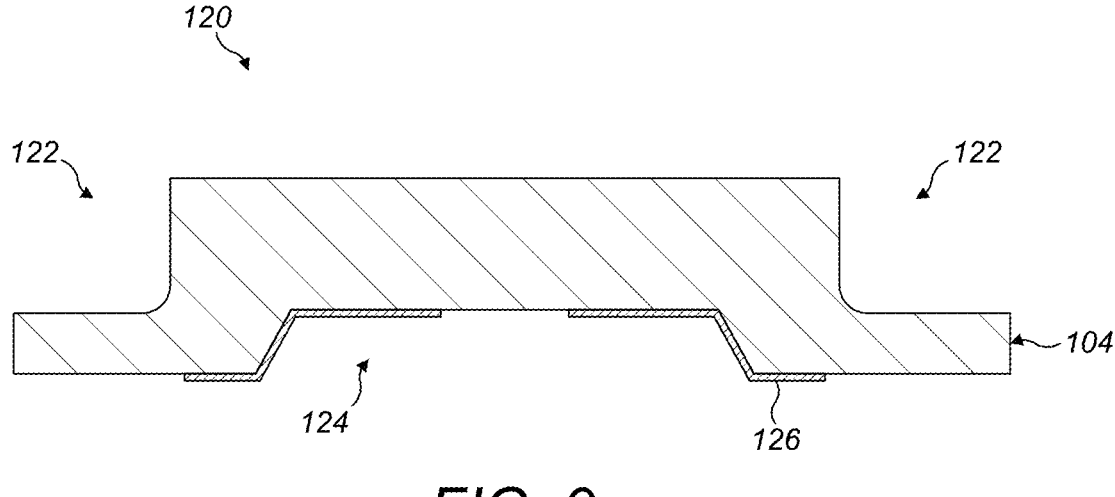
FIG. 9 is a schematic diagram of an etched cap layer formed using the method of FIG. 8.

Turning to FIG. 8, in another embodiment, the T-shaped profile etched into the cap wafer is formed prior to formation of the TSVs, for example prior to bonding of the cap wafer to the CMOS substrate wafer. In this embodiment, the CMOS wafer comprising the multiple substrate portions 102 is formed (Step 300) using any suitable semiconductor processing technique required to form the sensor devices 100. Similarly, the cap wafer 120 (FIG. 9) comprising multiple cap portions 104 is formed (Step 302) using any suitable semiconductor processing technique required to form the sensor device 100. The cap wafer 120 and the substrate wafer are again formed so that when brought together in an aligned manner, the individual substrate portions 102 and cap portions 104 are in registry and align to form respective sensor devices 100.

The cap wafer 120 is then spun-coated with photoresist, which is patterned using any suitable lithographic technique in order to form (Step 304) an oxide hard mask (not shown) on the cap wafer 120 and thereby define the window portions 108. The cap wafer 120 is then etched (Step 306) using a suitable etching technique, for example DRIE. As can be discerned from the above-described steps, in this example, the T-shaped profiles 122 are etched after other features of the cap portions 104 relating to the operation of the sensor devices 100 have been formed, for example etching of part of the cavity 124 and deposition of the layer of getter material 126. Thereafter, the oxide hard mask is removed using any suitable oxide removal technique.

Figure 10:
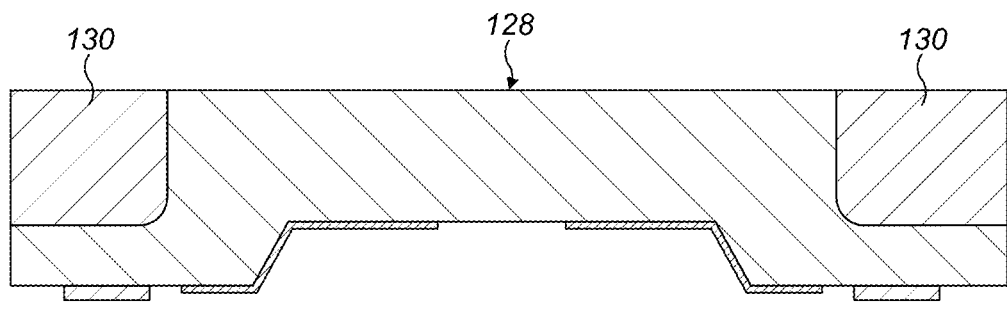
FIG. 10 is a schematic diagram of a filled cap layer formed using the method of FIG. 8.

Referring to FIG. 10, once the T-shaped profiles 122 have been etched, the planar nature of an upper surface 128 of the cap wafer 120 is reinstated by replacing (Step 308) the removed material of the cap wafer 120 with a thermally resistant polymer 130 or any other suitable filler material, for example HD polyimide available from HD Microsystems LLC, or SU-8 photoresist. Optionally, the upper surface 128 of the cap wafer 120 can undergo planarization if required.

The CMOS substrate wafer is then bonded (Step 310) to the cap wafer 120 in the aligned manner already described above in relation to FIG. 3. Any suitable bonding technique can be employed, for example glass-frit bonding or Aluminum Germanium eutectic bonding or oxide fusion bonding techniques. In this example, the melting point of the filler material is greater than the temperature employed for bonding the CMOS substrate wafer to the cap wafer.

Thereafter, the CMOS substrate wafer is prepared for the formation of the TSVs therethrough by thinning (Step 312) the CMOS substrate wafer and thus all the respective substrate portions 102. In this regard, the CMOS substrate wafer can again be thinned to any suitable thickness, for example between about 200 and about 500 microns. In this example, the DRIE technique is employed, but any other suitable etching technique can be used.

The TSVs are then formed (Step 314) in the CMOS substrate wafer using the DRIE technique mentioned above or a metal assisted chemical etching technique. In this example, electrical contacts are formed on the backside (not shown) of each substrate portion 102 of the CMOS substrate wafer and are electrically connected to the TSVs, respectively.

After the TSVs have been formed, the filler material 130 can be removed using any suitable "lift off" process, for example a wet chemical etching process.

Thereafter, the combined cap and CMOS substrate wafers bonded together are diced (Step 316) to form individual sensor dies constituting the sensor devices 100.

In other examples, the filler material 130 can be removed following dicing of the combined cap and CMOS substrate wafers.

Figure 11:
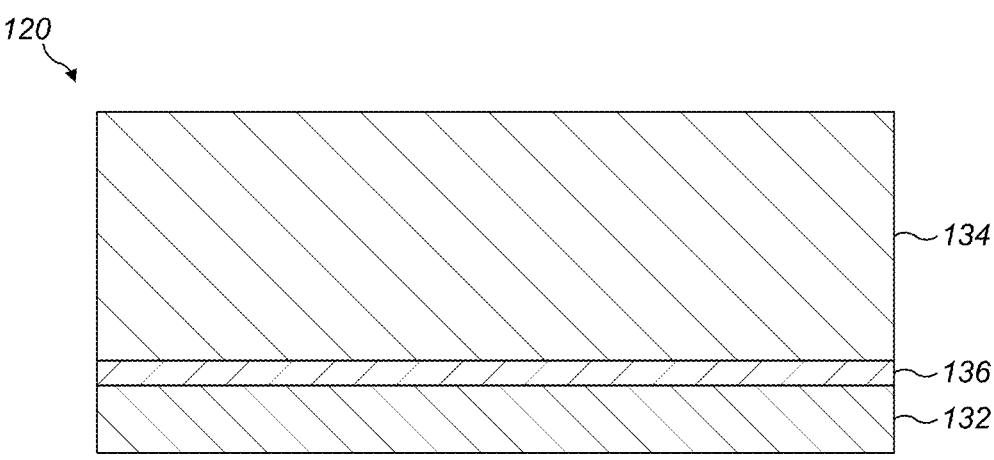
FIG. 11 is a schematic diagram of a Silicon-On-Insulator (SOI) wafer prior to processing as a cap wafer for a modification to the method of FIG. 3 and constituting a third embodiment of the invention.

In another embodiment, the cap wafer 120 is formed as a Silicon-On-Insulator (SOI) wafer as opposed to being formed from bulk silicon. Referring to FIG. 11, the cap wafer 120 therefore initially comprises a first layer of silicon 132 and a second layer of silicon 134 with a layer of silicon oxide 136 sandwiched between the first and second layers of silicon 132, 134. The layer of silicon oxide 136 is effectively "buried" within the sandwich 132, 134, 136 and is used for so-called "etch stop" control purposes in order to improve uniformity of etch depth across the cap wafer 120.

Referring back to FIG. 3, the CMOS substrate wafer is processed (Step 200) as already described above in relation to the first method of FIG. 3. Similarly, the cap wafer 120 is processed (Step 202) as already described above in relation to the first method of FIG. 3, but the cap wafer 120 is now the SOI cap wafer.

As in previous examples, the cap wafer and the substrate wafer are formed so that when brought together in an aligned manner, the individual substrate portions 102 and cap portions 104 are in registry and align to form respective sensor devices 100.

In this example, the CMOS substrate wafer is also bonded (Step 204) to the SOI cap wafer 120 in the aligned manner described above. Any suitable bonding technique can be employed, for example glass-frit bonding or Aluminum Germanium eutectic bonding or oxide fusion bonding techniques.

Thereafter, the CMOS substrate wafer is prepared for the formation of TSVs therethrough by thinning (Step 206) the CMOS substrate and thus all the respective substrate portions 102. In this regard, the CMOS substrate can be thinned to any suitable thickness for example between about 200 and about 500 microns. In this example, the DRIE technique is employed, but any other suitable etching technique can be used.

Figure 12:
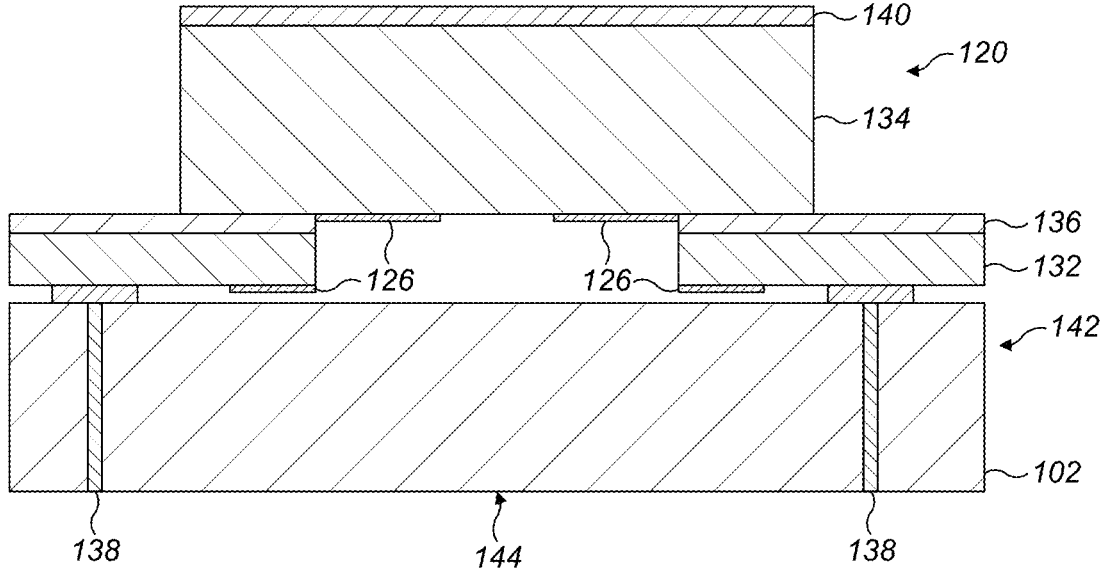
FIG. 12 is a schematic diagram of an etched cap layer formed using the modified method of FIG. 3.

Photoresist is then spun coated onto the second layer of silicon 134 of the SOI cap wafer 120 and patterned using any suitable lithographic processing technique in order to form (Step 208) an oxide hard mask 140 (FIG. 12) on the SOI cap wafer 120 and thus define the window portions 108. The TSVs 138 are then formed (Step 210) in the CMOS substrate wafer 142 using the DRIE technique mentioned above or a metal assisted chemical etching technique. In this example, electrical contacts (not shown) are formed on a backside 144 of each substrate portion 102 of the CMOS substrate wafer 142 and are electrically connected to the TSVs 138, respectively.

Once the TSVs have been formed, the second layer of silicon 134 of the SOI cap wafer is DRIE etched (Step 212) to a desired depth dictated by the presence of the layer of oxide 136 in order to create the T-shaped profiles of the sensor devices 100. As a consequence of etching, the layer of oxide 136 is reached and thus a portion of the layer of oxide 136 is exposed. DRIE is employed in order to achieve substantially vertical side walls. However, where slanted sidewalls are acceptable, a wet etching technique can be employed. Thereafter, the combined cap and CMOS substrate wafers 120, 142 bonded together are diced (Step 214) to form individual sensor dies constituting the sensor devices 100.

Figure 13:
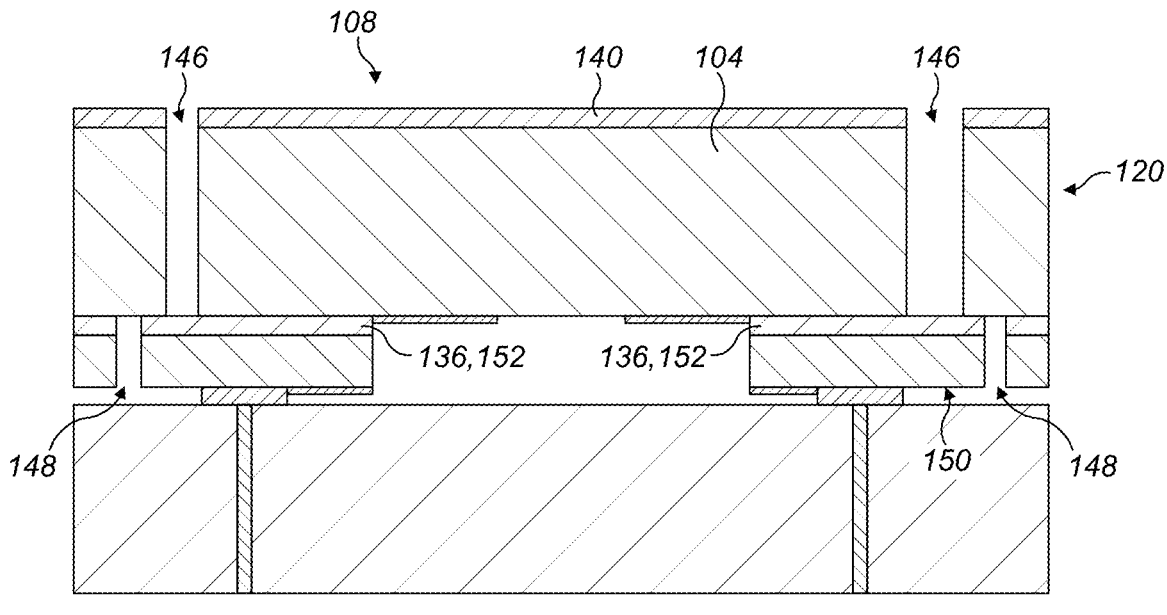
FIG. 13 is a schematic diagram of another etched cap layer formed using another modification to the method of FIG. 3.
Figure 14:
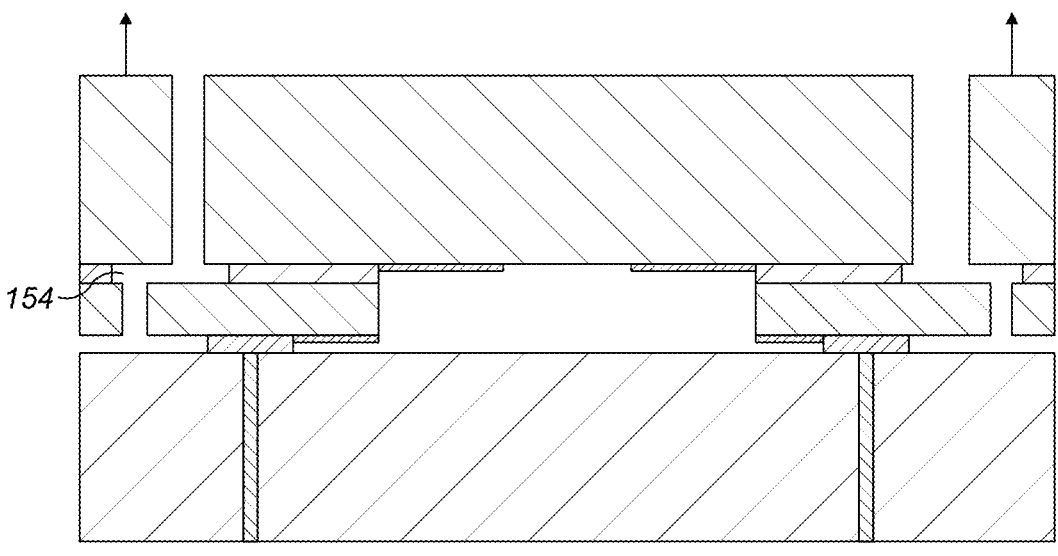
FIG. 14 is a schematic diagram the another etched cap layer of FIG. 13 further etched in accordance with the another modification to the method of FIG. 3.

Although in the above examples, dicing is employed to separate the individual devices, such dicing can lead to chipping of the edges of individual devices. Consequently, in another example (FIG. 13), in order to reduce the risk of chipping individual devices when dicing, the hard oxide mask 140 formed over the SOI cap wafer 120 can be patterned to define first upper trenches or channels 146 around the window portions 108 to be defined instead of completely removing material peripheral to the intended location of the window portions 108. Additional second lower trenches or channels 148 are also etched into a backside 150 of the SOI cap wafer 150 so that the upper trenches 146 are separated from the lower trenches 148 by portions 152 of the layer of oxide 136, i.e. each trench exposes respective parts of the portions 152 of the layer of oxide. The lower trenches 148 are further from a central longitudinal axis (passing through the window portion 108 to be formed) of the cap portion 104 than the upper trenches 146. These upper and lower trenches 146, 148 are formed prior to bonding the SOI cap wafer 120 to the CMOS substrate wafer 142 and the portions 152 of the layer of oxide 136 linking the upper and lower trenches 146, 148 serves as a removable connection between the trenches 146, 148 to enable liberation of any unwanted excess cap layer material from the SOI cap wafer 120. With the exception of processing the SOI cap layer 120 in the manner described above where the trenches 146, 148 are formed instead of the complete etching of the excess material of the SOI cap layer 120 as described in relation to FIG. 12, the SOI cap wafer 120 and the CMOS substrate wafer 142 are otherwise processed in accordance with the method employed in relation to FIG. 12. Following dicing of the combined CMOS substrate wafer 142 and the SOI cap layer 120, the excess material of the SOI cap layer 120 is removed by employing a hydrofluoric acid vapor etch stage to remove the portions 152 of the layer of oxide 136 anchoring the excess silicon of the SOI cap wafer 120 to the cap portion 104 of the sensor device 100. Referring to FIG. 14, a pathway is thus formed from the top of the SOI wafer 120 to the bottom of the SOI cap wafer 120 thereby separating the excess material about the window portion 108 and the remaining periphery of the cap portion 104. In this way, the remaining unwanted parts of the SOI wafer 120 are separated from the devices and without risk of chipping, thereby improving the quality of the finish of the window portion 108 and the sealing surface 106.

In the above examples, etching techniques have been employed to separate the devices, i.e. dice the wafer into devices. However, in other examples, other suitable techniques can be employed to perform dicing, for example laser drilling or laser ablation. For laser ablation, the oxide hard mask 116 can also serve as a protection layer against ablated residuals created during this process.

Whilst CMOS substrate wafers have been employed in the examples set forth above, the skilled person should appreciate that other kinds of substrate technologies can be employed, for example non-CMOS substrates can be employed that do not comprise any integrated circuits operably coupled to the sensor formed.

What is claimed is:

1. A method of manufacturing a sensor device, the method comprising:

forming a substrate comprising a sensor element;

forming a cap layer;

bonding the cap layer to the substrate;

thinning the substrate;

forming a via between the sensor element and a back side of the thinned substrate;

providing an electrical connection between the sensor element and the back side of the thinned substrate;

wherein the method further comprises:

forming a mask on the cap layer to define an area about a predetermined window region before forming of the via; and removing a portion of the cap layer about the predetermined window region of the cap layer after formation of the via.

2. The method according to claim 1, wherein forming the cap layer further comprises:

disposing a getter material on at least part of an inner surface of the cap layer.

3. The method according to claim 1, wherein bonding the cap layer to the substrate layer comprises:

glass frit bonding the cap layer to the substrate layer.

4. The method according to claim 3, wherein bonding the cap layer to the substrate layer further comprises:

bonding the cap layer to the substrate layer in a pressurized atmosphere comprising a predetermined gas at a predetermined pressure.

5. The method according to claim 1, wherein thinning the substrate comprises:

thinning a backside of the substrate using a DRIE technique.

6. The method according to claim 1, further comprising:

etching the via using a DRIE technique.

7. The method according to claim 1, wherein removing the portion of the cap layer about the predetermined window region of the cap layer comprises:

etching the portion of the cap layer using a DRIE technique.

8. A method of manufacturing a sensor device, the method comprising:

forming a substrate comprising a sensor element;

forming a cap layer;

bonding the cap layer to the substrate;

thinning the substrate;

forming a via between the sensor element and a back side of the thinned substrate;

providing an electrical connection between the sensor element and the back side of the thinned substrate;

wherein the method further comprises:

forming a mask on the cap layer to define an area about a predetermined window region before formation of the via;

removing a portion of the cap layer about the predetermined window region of the cap layer before formation of the via; and replacing the removed portion of the cap layer with another material to restore the cap layer to having a planar structure.

9. The method according to claim 8, wherein the another material is a thermally resistant polymer.

10. The method according to claim 8, wherein the replacement material is removed after formation of the via.

11. The method according to claim 8, wherein the cap layer is bonded to the substrate at a predetermined temperature, and the replacement material has a higher melting point than the predetermined temperature.

12. A method of manufacturing a sensor device, the method comprising:

forming a substrate comprising a sensor element;

forming a cap layer;

bonding the cap layer to the substrate;

thinning the substrate;

forming a via between the sensor element and a back side of the thinned substrate;

providing an electrical connection between the sensor element and the back side of the thinned substrate;

wherein formation of the cap layer comprises:

providing a first layer of silicon separated from a second layer of silicon by an oxide layer;

profiling the first layer of silicon in order provide a predetermined window region; and removing a portion of the second layer of silicon of the cap layer about the predetermined window region to expose a portion of the oxide layer, the portion of the second layer being removed after forming the via.

13. The method according to claim 12, wherein bonding the cap layer to the substrate comprises:

bonding the first layer of silicon to the substrate.

14. The method according to claim 12, further comprising:

depositing a mask on the second layer of silicon to define the portion of the second layer of silicon to be removed.

15. The method according to claim 14, further comprising: etching the masked second layer of silicon until the oxide layer is reached.

16. The method according to claim 14, further comprising:

etching a first channel about the predetermined window region to expose a portion of the oxide layer; and etching a second channel in the first layer of silicon, the second channel being further from a central axis of the cap layer than the first channel.

17. The method according to claim 16, further comprising:

etching the exposed portion of the oxide layer to release a part of the second layer of silicon that is not forming the window region.

18. The method according to claim 12, wherein the mask is deposited on the second layer of silicon prior to formation of the via.

* * * * *